United States Patent
Wijnands et al.

(10) Patent No.: US 10,242,740 B2
(45) Date of Patent: Mar. 26, 2019

(54) T-CAM BIER BIT-STRING LOOKUPS

(71) Applicant: Cisco Technology, Inc., San Jose, CA (US)

(72) Inventors: IJsbrand Wijnands, Leuven (BE); Gregory J. Shepherd, Eugene, OR (US)

(73) Assignee: Cisco Technology, Inc., San Jose, CA (US)

( * ) Notice: Subject to any disclaimer, the term of this patent is extended or adjusted under 35 U.S.C. 154(b) by 543 days.

(21) Appl. No.: 14/847,019

(22) Filed: Sep. 8, 2015

(65) Prior Publication Data

US 2017/0068453 A1 Mar. 9, 2017

(51) Int. Cl.
  *G06F 15/16* (2006.01)
  *G11C 15/00* (2006.01)
  *H04L 12/701* (2013.01)

(52) U.S. Cl.
  CPC .............. *G11C 15/00* (2013.01); *H04L 45/00* (2013.01)

(58) Field of Classification Search
  CPC .................. H04L 45/54; H04L 45/7457; G06F 17/30982
  USPC ................................................ 709/217, 219
  See application file for complete search history.

(56) References Cited

U.S. PATENT DOCUMENTS

| | | | |
|---|---|---|---|
| 6,876,655 B1 | 4/2005 | Afek et al. | |
| 7,424,014 B2 * | 9/2008 | Mattes | H04L 45/00 370/389 |
| 7,552,275 B1 | 6/2009 | Krishnan | |
| 7,555,594 B2 | 6/2009 | Venkatachary | |
| 9,619,584 B1 * | 4/2017 | Roitshtein | G11C 15/00 |
| 2006/0262583 A1 * | 11/2006 | Venkatachary | H03M 7/30 365/49.17 |
| 2014/0258679 A1 * | 9/2014 | McGee | G06F 13/4282 712/36 |
| 2015/0032732 A1 | 1/2015 | Sundstrom | |

OTHER PUBLICATIONS

Wijnands, Ijsbrand, Multicast Using Bit Index Explicit Replication (Sep. 22, 2014) Can be seen at: https://tools.ietf.org/html/draft-wijnands-bier-architecture-00.

* cited by examiner

*Primary Examiner* — Wing F Chan
*Assistant Examiner* — Andrew Woo

(57) ABSTRACT

In one embodiment of a system, apparatus, and method the system, apparatus, and method including a table of neighboring network nodes stored in a ternary content-addressable memory (T-CAM), each one of the neighboring network nodes being indexed as a Bit Index Explicit Replication (BIER) bitmap, a plurality of selector lines in the T-CAM, each selector line associated with one neighboring network node, a bit set in the T-CAM for one single selector line among the plurality of selector lines such that the set bit is associated with a single match line, the single match line to be set high when an input on the selector line matches the set bit and otherwise to be set low, and a plurality of bits set to do not care for other selector lines, beside the one single selector line, associated with the single match line. Related systems, apparatuses, and methods are also described.

20 Claims, 4 Drawing Sheets

| T-CAM | | | | | ML NUM. |
|---|---|---|---|---|---|
| d | d | d | 1 | d | 0x10 |
| d | d | 1 | d | d | 0x20 |
| d | 1 | d | d | d | 0x30 |
| 1 | d | d | d | d | 0x40 |
| d | d | d | d | 1 | 0x41 |

T-CAM BIER BIT-STRING LOOKUPS

FIELD OF THE INVENTION

The present invention generally relates to uses of ternary content-addressable memory (T-CAM) to perform lookup operations.

BACKGROUND OF THE INVENTION

Network nodes forward data. Network nodes may take form in one or more routers, one or more bridges, one or more switches, one or more servers, or any other suitable communications processing device. The data is commonly formatted as packets and forwarded using forwarding tables. A packet is a formatted unit of data that typically contains control information and payload data. Control information may include: information that identifies sources and destinations, such as addresses, error detection codes like checksums, sequencing information, etc. Control information is typically found in packet headers and trailers. Payload data is typically located between the packet headers and trailers.

Forwarding packets involves various processes that, while simple in concept, can be complex. The processes involved in forwarding packets vary, depending on the type of forwarding method used. Multicast is the preferred method of data forwarding for many networks. One reason for this is that multicast is a bandwidth-conserving technology that reduces traffic by simultaneously delivering data to multiple receivers. However, some network environments are not well suited to support multicast. Doing so in such environments often involves discovering and maintaining significant amounts of control, or state, information. Setting up and maintaining this control information has a tendency to become complex and costly in terms of computing resources, and can become a major limiting factor in overall network performance. Another issue with multicast is that due to packet delivery mechanisms used, packets are sometimes forwarded to locations to which the forwarding of these packets creates an unwelcome burden on network performance. Overcoming this burden by traditional means involves generation and maintenance of even more control information.

In conventional IP multicast forwarding, the packets of a given multicast "flow" are forwarded along a tree that has been constructed for the specific purpose of carrying that flow. This requires transit nodes to maintain state on a per-flow basis, and requires the transit nodes to participate in multicast-specific tree building protocols. The flow to which a packet belongs is determined by its IP source and destination address fields.

BIER (Bit Index Explicit Replication) is an alternative method of multicast forwarding. It does not require any multicast-specific trees, and hence does not require any multicast-specific tree building protocols. Within a given "BIER domain", an ingress node encapsulates a multicast data packet in a "BIER header". The BIER header identifies the packet's egress nodes in that domain. Each possible egress node is represented by a single bit within a bitstring; to send a packet to a particular set of egress nodes, the ingress node sets the bits for each of those egress nodes, and clears the other bits in the bitstring. The set bits are be forwarded and replicated at each network node by flooding an IGP (i.e. the interior gateway protocol) in use in the local network with a unique LSA (i.e. a link state advertisement) so that each routing table/RIB (routing information base) in the local network has the bit assignment. Each packet can then be forwarded along the unicast shortest path tree from the ingress node to the egress nodes. Thus there are no per-flow forwarding entries.

BRIEF DESCRIPTION OF THE DRAWINGS

The present invention will be understood and appreciated more fully from the following detailed description, taken in conjunction with the drawings in which.

DESCRIPTION OF EXAMPLE EMBODIMENTS

Overview

A system, apparatus, and method are described, the system and method including a table of neighboring network nodes stored in a ternary content-addressable memory (T-CAM), each one of the neighboring network nodes being indexed as a Bit Index Explicit Replication (BIER) bitmap, a plurality of selector lines in the T-CAM, each selector line associated with one neighboring network node, a bit set in the T-CAM for a one single selector line such that the set bit is associated with a single match line, the single match line to be set high when an input on the selector line matches the set bit and otherwise to be set low, and a plurality of bits set to do not care for other selector lines, beside the one single selector line, associated with the single match line. Related systems, apparatuses, and methods are also described.

Exemplary Embodiments

Figure 1:
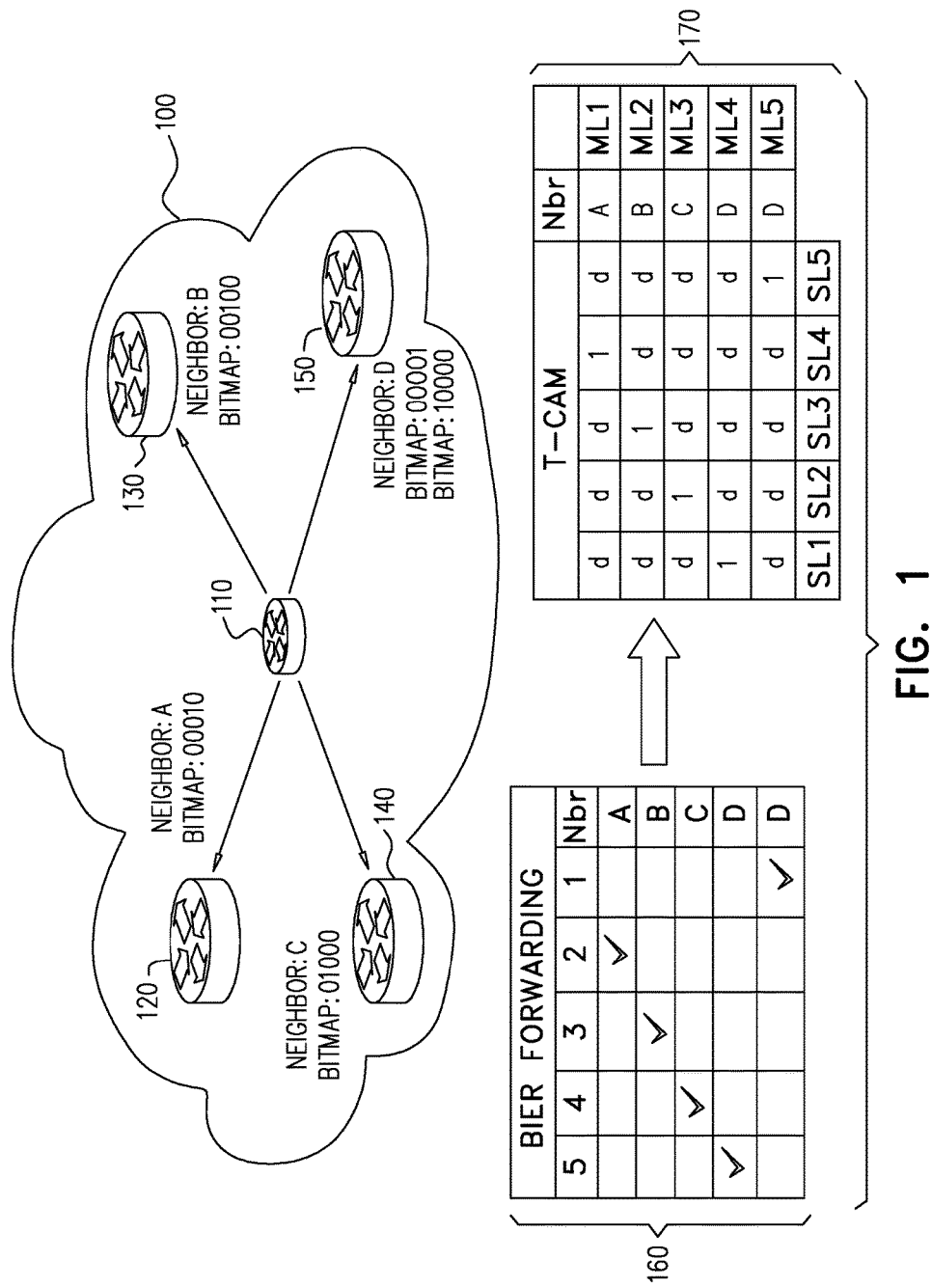
FIG. 1 is a simplified illustration of a network in which BIER (Bit Index Explicit Replication) is implemented, and T-CAM BIER bit-string lookups occur, the network constructed and operative in accordance with an embodiment of the present invention.

Reference is now made to FIG. 1, which is a simplified illustration of a network 100, in which BIER (Bit Index Explicit Replication) is implemented, and T-CAM BIER bit-string lookups occur, the network 100 constructed and operative in accordance with an embodiment of the present invention. The network 100 of FIG. 1 depicts a first switch 110, the first switch 110 having four neighboring switches or other network nodes, such as hubs, routers, and so forth: Neighbor A 120; Neighbor B 130; Neighbor C 140; and Neighbor D 150. Because the network 100 is a network where BIER is implemented, each neighboring switch is stored in routing tables of the first switch 100 as a bitmap. The following table indicates the relationship between the neighboring switches and their associated bitmaps.

| Neighbor | Bitmap |
| --- | --- |
| A | 00010 |
| B | 00100 |
| C | 01000 |

| Neighbor | Bitmap |
| --- | --- |
| D | 00001 |
| D | 10000 |

The above table indicates BIER forwarding information. That is to say, a BIER packet with a bitmap of 00010 is forwarded to neighbor A; a BIER packet with a bitmap of 00100 is forwarded to neighbor B, and so forth. The BIER forwarding information is also summarized in the table 160 of FIG. 1.

Content addressable memory (CAM) is a special type of computer memory typically used in certain very-high-speed searching applications. CAM is designed to search its entire memory in a single operation (i.e. clock cycle), and, accordingly, it is faster than RAM in virtually all search applications. CAM is typically designed such that the user supplies a data word and the CAM searches its entire memory to see if that data word is stored anywhere in the CAM. If the data word is found, the CAM returns a list of one or more storage addresses where the data word was found (and in some architectures, the CAM also returns the data word, or other associated pieces of data). In typical CAM memory, data words are stored as strings of bits, i.e. 0s and 1s.

Ternary-CAM (T-CAM) allows a third state to be stored, beyond 0s and 1s. The third state allows storing a "don't care" (d) value in the T-CAM. By way of example, a T-CAM may store a value of "10dd0", which will match a search for any of 10110, 10001, 10011, and so forth. That is to say that either a 0 or a 1 will produce a match with a "d"—always yielding a result of TRUE. FIG. 1 depicts the BIER forwarding information in table 160 as the information may be stored in a table 170 in an associated T-CAM memory.

In the table 170 each neighbor (Nbr) has an associated match line (ML), indicated of the right-most column in the table 170. Thus, for example, a frame entering the first switch 110 having a forwarding field of 00111 would, respectively, be forwarded to neighbors B, A, and D. The match line in circuitry associated with the T-CAM would, accordingly, be set high for these three neighbors. On the other hand, the match line in circuitry associated with the T-CAM would, accordingly, be set low for neighbor C, since the frame is not to be forwarded to neighbor C.

Neighboring network devices, such as neighbors A 120, B 130, C 140, and D 150 are each associated with one match line per bit position in the bitmap. Each bit position in the T-CAM is programmed into a single match line, and only one bit position is allowed per match line. Thus, the two bit maps for neighbor D use two different match lines, match line ML 4 and match line ML 5.

A selector line, such as SL1, SL2, SL3, SL4, and SL5 indicated in table 170, in circuitry associated with the T-CAM represents the bit position. All other bit positions are marked in the T-CAM as "d" (don't care). Thus, a single bit which is set in the BIER bit stream will cause a single selector line to match a single match line.

Figure 2:
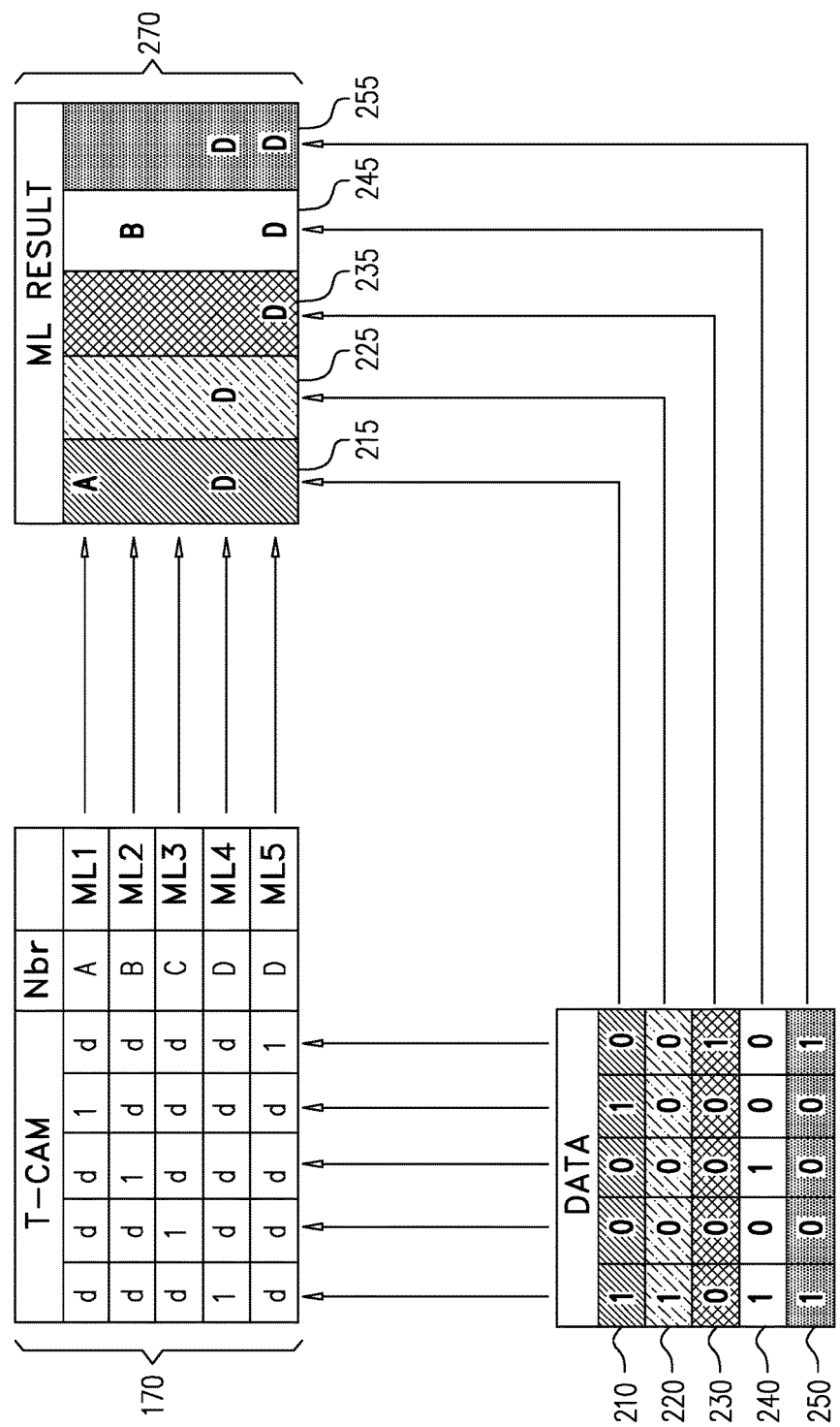
FIG. 2 is a depiction of a BIER forwarding table mapped to a T-CAM match line/neighbor table for use in the network of FIG. 1.

Reference is now made to FIG. 2, which is a depiction of a BIER forwarding table (such as table 160 of FIG. 1) mapped to a T-CAM match line/neighbor table 170 for use in the network of FIG. 1. Table 170 is depicted without indicating the selector lines SL1, SL2, SL3, SL4, and SL5, which do appear in FIG. 1. Additionally, five data strings 210, 220, 230, 240, and 250 are shown as being input to the table 170. Each of the data strings are depicted in FIG. 2 having a distinct hashing patterns which is maintained in a match line result table 270. The hashing patterns are provided as a convenience, and are of no intrinsic significance. As will be explained below, data which appears horizontally in the groups of data strings 210, 220, 230, 240, and 250 are evaluated and depicted vertically in the match line result table 270. Therefore, by way of example, as will be explained below, data line 210 evaluates to A.

First data line 210 is 10010. Applying the first data line 210 to the table 170, results in a match for neighbor D (the first 1 in 10010) and a match for neighbor A (the second 1 in 10010). Accordingly, the voltage on match lines ML1 and ML4 are set high. Corresponding column 215 of match line result table 270 indicates that neighbors A and D result from the input data 10010 (i.e. first data line 210). As such, in one clock cycle, the output resulting from bitmap 10010 indicates that a BIER packet having the bitmap 10010 should be forwarded to neighbors A and D.

Second data line 220 is 10000. Applying the first data line 220 to the table 170, results in a match for neighbor D (the first 1 in 10000). Accordingly, the voltage on match line ML4 is set high. Corresponding column 225 of match line result table 270 indicates that neighbor D results from the input data 10000 (i.e. second data line 220). As such, in one clock cycle, the output resulting from bitmap 10000 indicates that a BIER packet having the bitmap 10000 should be forwarded to neighbor D.

Third data line 230 is 00001. Applying the third data line 220 to the table 170, results in a match for neighbor D (the first 1 in 00001). Accordingly, the voltage on match line ML5 is set high. Corresponding column 235 of match line result table 270 indicates that neighbor D results from the input data 00001 (i.e. third data line 230). As such, in one clock cycle, the output resulting from bitmap 00001 indicates that a BIER packet having the bitmap 00001 should be forwarded to neighbor D.

Fourth data line 240 is 10100. Applying the fourth data line 240 to the table 170, results in a match for neighbor D (the first 1 in 10010) and a match for neighbor B (the second 1 in 10100). Accordingly, the voltage on match lines ML1 and ML2 are set high. Corresponding column 245 of match line result table 270 indicates that neighbors A and B result from the input data 10010 (i.e. first data line 210). As such, in one clock cycle, the output resulting from bitmap 10100 indicates that a BIER packet having the bitmap 10100 should be forwarded to neighbors B and D.

Fifth data line 250 is 10001. Applying the fifth data line 250 to the table 170, results in two matches for neighbor D (the first 1 in 10001 and the second 1 in 10001). Accordingly, the voltage on match lines ML4 and ML5 should be set high. Corresponding column 255 of match line result table 270 indicates that neighbors D and D result from the input data 10001 (i.e. fifth data line 250). As such, in one clock cycle, the output resulting from bitmap 10001 would indicate that two identical BIER packets (both of which result from an input BIER packet having the bitmap 10001) are to be forwarded to neighbor D.

In that it is only required to send one copy of the BIER packet and not two copies to neighbor D, it is preferable to provide a solution whereby only one BIER packet is sent.

One approach which might be taken to solve the problem of sending only one copy of the BIER packet (instead of two copies) to a neighboring switch would be to program the T-CAM so that bit positions 1 and 5 of the bitmap (i.e. 10001) are both on the same match line. By way of example, consider what would happen if, in the example of FIG. 2, bit positions 1 and 5 were both programmed on ML4.

Figures 3, 4:
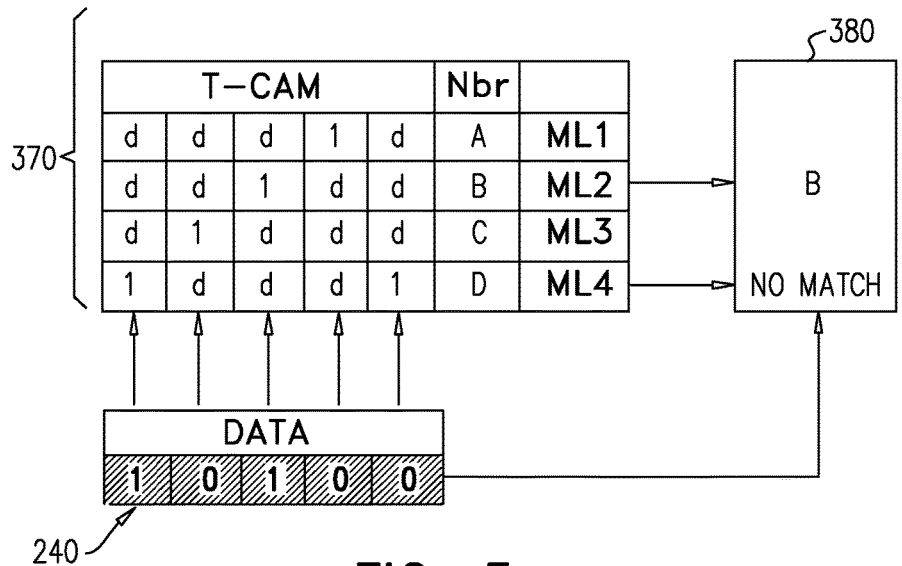
FIG. 3 is a depiction showing how data is mapped by a modification of the T-CAM match line/neighbor table of FIG. 2 into match line results.
FIG. 4 is a depiction of the T-CAM bit string lookup table of FIG. 1, encoded with a priority encoder.
Figure 5:
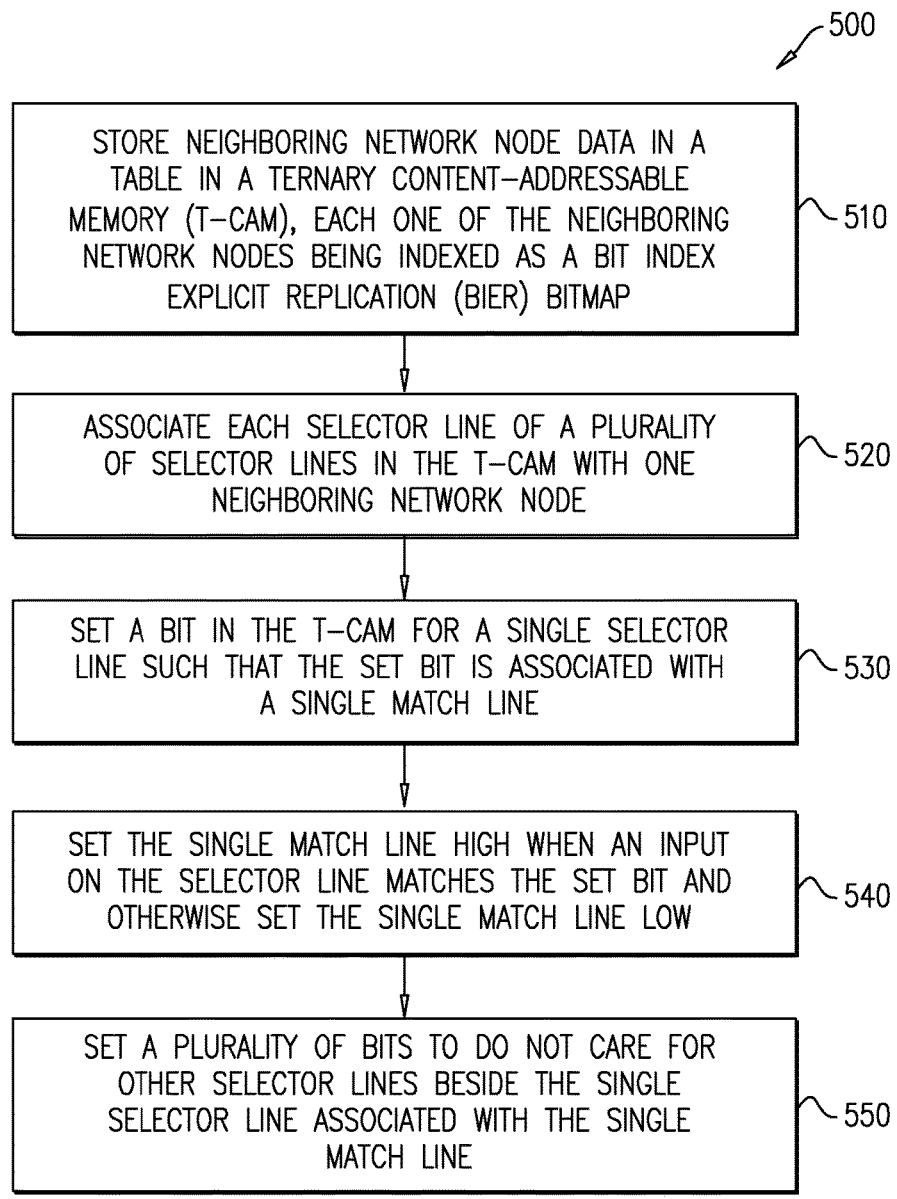
FIG. 5 is a simplified flow chart of a method of implementation of the system of FIG. 1.

Reference is now made to FIG. 3, which is a depiction showing mapping of data by a modification of the T-CAM match line/neighbor 370 table (which corresponds to table 170 of FIGS. 1 and 2) into match line results. Specifically, data line 240 of FIG. 2 is input into table 370. Table 370 is a somewhat modified version of table 170 of FIG. 2. The modification of table 370 is that both bit positions 1 and 5 have been programmed on ML4.

However, applying the fourth data line 240, i.e. 10100, into modified table 370 results in a match on the first bit, yielding a 1, and a non-match on the fifth bit. I.e., inputting the fifth bit, 0, into modified table 370 yields no match, and thus, the result of the match (i.e. 1) with the no match (i.e. 0) yields no match (that is to say that 1 AND 0 results in 0, i.e. no match).

Reference is now made to FIG. 4, which is a depiction of the T-CAM bit string lookup table of FIG. 1, encoded with a priority encoder. In order to overcome the difficulties resulting from the need to provide a solution where multiple bit positions in the bitmap may signal that packets are to be sent to the same neighbor, and to overcome the problem arising from assigning those same multiple bit positions in the bitmap to a single match line, the following solution is proposed. A hierarchy is created in the match line values. The hierarchy is encoded in a fashion such as the hierarchy depicted in FIG. 4.

Specifically, a priority encoder which compresses the multiple inputs into a single output is provided. Thus, the exemplary input of the fifth data line 250 (FIG. 2), which is 10001, yields a single output to neighbor D. That is to say, only one version of the BIER packet is sent to neighbor D, and not two, in keeping with the example of the fifth data line 250 of FIG. 2.

Turning specifically to FIG. 4, the match lines, in this example, are an 8 bit value, thereby allowing for 256 match lines. In the table 410 of FIG. 4, the 8-bit values of the match lines are divided into two parts. A 4-bit higher order is provided for neighbor numbers (in Hex), so neighbor A would be 0x10; neighbor B would be 0x20; neighbor C would be 0x30; and neighbor D would be 0x40.

The lower order of the 8-bit values would then be used for the match lines which would otherwise be duplicated. In the example of FIG. 3, the fifth bit of the bit map (00001) would be mapped to 0x41, as indicated in the bottom line 420 of table 410. Because table 410 depicts how a priority encoder may be implemented to overcome multiple bit values in the BIER bitmap mapping to the same neighbor, both match lines 0x40 and 0x41 would be compressed into the same output. Another way of looking at this situation would be that rather than logically ANDing the results, as in FIG. 3, the results are now logically ORed.

In still another embodiment, the problem of multiple, alternative mappings to the same neighbor, such as bitmaps 10000 and 00001 both mapping to neighbor D 150 (FIG. 1), may be solved by implementing multiple layers of tables. By way of example, in FIG. 4, a secondary table may be implemented, rather than implementing the priority encoder. In such an embodiment, an entry in the table of FIG. 4 might hold a reference to a location in a second table which is populated with mappings to neighbors. So, rather than the last two lines of table 410 mapping to match lines 0x40 and 0x41, they might both map to the same line or cell of a second table which points to neighbor D. Reference is now made to Fi g .5, which is a simplified flow chart 500 of a method of implementation of the system of FIG. 1. At step 510 a neighboring network node is stored in a table in a T-CAM, each one of the neighboring network nodes being indexed as a BIER bitmap. At step 520 each selector line of a plurality of selector lines in the T-CAM is associated with one neighboring network node. At step 530 a bit is set in the T-CAM for a single selector line such that the set bit is associated with a single match line. At 540 the single match line is set high when an input on the selector line matches the set bit and otherwise the single match line is set low. At step 550 a plurality bits is set to do not care for other selector lines beside the single selector line associated with the single match line.

It is appreciated that software components of the present invention may, if desired, be implemented in ROM (read only memory) form. The software components may, generally, be implemented in hardware, if desired, using conventional techniques. It is further appreciated that the software components may be instantiated, for example: as a computer program product or on a tangible medium. In some cases, it may be possible to instantiate the software components as a signal interpretable by an appropriate computer, although such an instantiation may be excluded in certain embodiments of the present invention.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined by the appended claims and equivalents thereof.

What is claimed is:

1. A system comprising:
    a processor and a ternary content-addressable memory (T-CAM);
    the T-CAM storing a table of neighboring network nodes, each one of the neighboring network nodes being indexed in the table as one or more of a plurality of match lines each comprising a plurality of bit positions forming a Bit Index Explicit Replication (BIER) bitmap associated with the corresponding neighboring network node;
    a plurality of selector lines indexed in the T-CAM with the neighboring network nodes, wherein each of the plurality of selector lines is paired with one bit position of each match line for which a corresponding neighboring network node is indexed;
    wherein, for a first selector line, a first bit position associated with a first match line has a bit that is set to a first value and each of the other bit positions associated with match lines other than the first match line bit positions have bits that are set to a second value indicative of do not care;
    wherein, for a second selector line, a second bit position associated with a second match line has a bit that is set to the first value and each of the other bit positions associated with match lines other than the second match line bit positions have bits that are set to the second value indicative of do not care; and
    wherein when a BIER packet comprising a plurality of bit positions each associated with one of the plurality of selector lines is received at the system, a voltage on the first match line is to be set high when a bit position of the BIER packet associated with the first selector line has a value that matches the first value at the first bit position associated with the first match line, and otherwise the voltage on the first match line is to be set low, wherein the BIER packet is to be forwarded based on the voltage set on the first match line.

2. The system according to claim 1 wherein when more than one bit position in the BIER bitmap is associated with one single neighboring network node, a priority encoder is implemented, wherein the priority encoder compresses each one of the more than one bit position in the BIER bitmap to a single one match line to be set high.

3. The system according to claim 1 wherein when more than one bit position in the BIER bitmap is associated with one single neighboring network node, a second table is implemented, wherein the second table associates each bit of the BIER bitmap associated with the one single neighboring network node in the T-CAM with a single entry on the second table, the single entry on the second table mapping to a single one of the single match lines associated with the one single neighboring network node.

4. The system according to claim 1 wherein the bit that is set to the first value is set to a value of 1.

5. The system according to claim 1 wherein the voltage on the first match line is to be set high in a single clock cycle.

6. The system according to claim 1 wherein when the voltage set on the first match line is set high, the BIER packet is to be forwarded to a neighboring network node corresponding to the first match line.

7. The system according to claim 1 wherein the voltage set on the first match line being set low is an indication that the BIER packet is not to be forwarded to a neighboring network node corresponding to the first match line.

8. The system according to claim 1 wherein when the BIER packet is received at the system, a voltage on the second match line is to be set high when a bit position of the BIER packet associated with the second selector line has a value that matches the first value at the second bit position associated with the second match line, and otherwise the voltage on the second match line is to be set low, wherein the BIER packet is to be forwarded based on the voltage set on the second match line.

9. The system according to claim 1 wherein when a voltage set on the second match line is set high, the BIER packet is to be forwarded to a neighboring network node corresponding to the second match line.

10. The system according to claim 1 wherein the voltage set on the second match line being set low is an indication that the BIER packet is not to be forwarded to a neighboring network node corresponding to the second match line.

11. A method comprising:
storing neighboring network node data in a table in a ternary content-addressable memory (T-CAM), each one of the neighboring network nodes being indexed table as one or more of a plurality of match lines each comprising a plurality of bit positions forming a Bit Index Explicit Replication (BIER) bitmap associated with the corresponding neighboring network node;
indexing a plurality of selector lines in the TCAM with the neighboring network nodes, wherein each selector line of the plurality of selector lines in the T-CAM is paired with one bit position of each match line for which a corresponding neighboring network node is indexed;
for a first selector line, setting a bit for a first bit position associated with a first match line to a first value and setting each of the other bit positions associated with match lines other than the first match line bit positions to a second value indicative of do not care;
for a second selector line, setting a bit for a second bit position associated with a second match line to the first value and setting each of the other bit positions associated with match lines other than the second match line bit positions to the second value indicative of do not care;
receiving a BIER packet comprising a plurality of bit positions each associated with one of the plurality of selector lines; and
setting a voltage on the first match line high when a bit position of the BIER packet associated with the first selector line matches the first value at the first bit position associated with the first match line and otherwise setting the voltage on the first match line low, wherein the BIER packet is forwarded based on the voltage set on the first match line.

12. The method according to claim 11 and further comprising implementing a priority encoder when more than one bit position in the BIER bitmap is associated with one single neighboring network node, wherein the priority encoder compresses each one of the more than one bit position in the BIER bitmap to a single one match line to be set high.

13. The method according to claim 11 wherein when more than one bit position in the BIER bitmap is associated with one single neighboring network node, a second table is implemented, wherein the second table associates each bit of the BIER bitmap associated with the one single neighboring network node in the T-CAM with a single entry on the second table, the single entry on the second table mapping to a single one of the single match lines associated with the one single neighboring network node.

14. The method according to claim 11 wherein setting the bit to the first value comprises setting the bit to a 1 bit.

15. The method according to claim 11 wherein the voltage on the first match line to be set high is set to high in a single clock cycle.

16. The method according to claim 11 further comprising, when the voltage set on the first match line is set high, forwarding the BIER packet to a neighboring node corresponding to the first match line.

17. The method according to claim 11 wherein the voltage on the first match line being set low is an indication not to forward the BIER packet to a neighboring node corresponding to the first match line.

18. The method according to claim 11 wherein the voltage on the second match line being set low is an indication not to forward the BIER packet to a neighboring node corresponding to the second match line.

19. The method according to claim 11 further comprising setting a voltage on the second match line high when a bit position of the BIER packet associated with the second selector line matches the first value at the second bit position associated with the second match line and otherwise setting the voltage on the second match line low.

20. The method according to claim 11 further comprising, when a voltage set on the second match line is set high, forwarding the BIER packet to a neighboring node corresponding to the second match line.

* * * * *